(12) United States Patent
Liu

(10) Patent No.: US 8,432,698 B2
(45) Date of Patent: Apr. 30, 2013

(54) ELECTRONIC SYSTEM AND HEAT DISSIPATION DEVICE THEREOF

(75) Inventor: Tao Liu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

(*) Notice: Subject to any disclaimer, the term of this patent is extended or adjusted under 35 U.S.C. 154(b) by 173 days.

(21) Appl. No.: 13/071,477

(22) Filed: Mar. 24, 2011

(65) Prior Publication Data

US 2012/0170225 A1 Jul. 5, 2012

(30) Foreign Application Priority Data

Dec. 31, 2010 (CN) .......................... 2010 1 0616931

(51) Int. Cl.
*H05K 7/20* (2006.01)

(52) U.S. Cl.
USPC .............. 361/720; 361/679.48; 361/679.54; 361/704; 361/695; 361/697; 361/719; 165/80.3; 165/104.33; 165/121; 165/122; 165/185

(58) Field of Classification Search ........... 361/679.46–679.54, 690–697, 704–722, 732, 735, 740–742, 361/747–748, 759; 165/80.2–80.5, 104.33, 165/121–126, 185; 174/16.1, 16.3, 252; 248/505, 510; 24/297, 457, 473, 508, 458, 24/625; 29/832, 834, 842, 890.03

See application file for complete search history.

(56) References Cited

U.S. PATENT DOCUMENTS

| | | | | |
|---|---|---|---|---|
| 6,223,815 B1* | 5/2001 | Shibasaki | ..................... | 165/185 |
| 6,331,937 B1* | 12/2001 | Bartyzel | ................. | 361/679.54 |
| 6,535,389 B2* | 3/2003 | Rodriguez et al. | ............ | 361/719 |
| 6,549,410 B1* | 4/2003 | Cohen | ......................... | 361/704 |
| 6,549,420 B2* | 4/2003 | Noonan et al. | ................ | 361/783 |
| 7,042,727 B2* | 5/2006 | Ulen et al. | .................... | 361/704 |
| 7,286,371 B2* | 10/2007 | Unrein | ......................... | 361/810 |
| 7,315,449 B2* | 1/2008 | Lewis | .......................... | 361/702 |
| 7,468,889 B2* | 12/2008 | Su | ................................ | 361/719 |
| 7,864,536 B2* | 1/2011 | Li et al. | ........................ | 361/719 |
| 7,983,047 B2* | 7/2011 | Wu | .............................. | 361/719 |

* cited by examiner

*Primary Examiner* — Michail V Datskovskiy
(74) *Attorney, Agent, or Firm* — Altis Law Group, Inc.

(57) ABSTRACT

An exemplary heat dissipation device is adapted for dissipating heat generated by an electronic component mounted on a printed circuit board. The printed circuit board is secured on a casing of an electronic system. The heat dissipation device includes a heat sink disposed on the electronic component; and a plurality of fasteners extending through the heat sink, respectively, to assemble the heat sink to the printed circuit board. Each of the fasteners includes a supporting member fixed in the printed circuit board, an engaging member fixed in the board, and a screwing post engaging with the heat sink. A bottom portion of the screwing post extends through the printed circuit board via the supporting member, and is screwed into the engaging member.

17 Claims, 1 Drawing Sheet

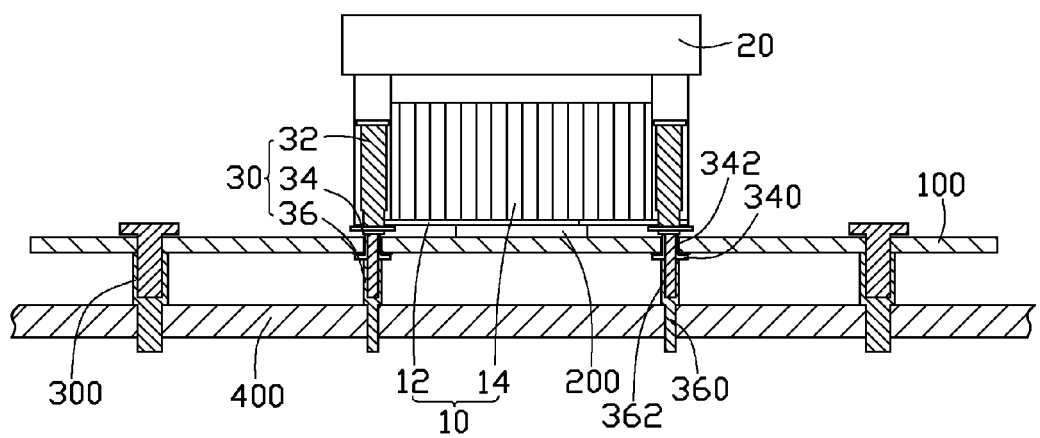

ELECTRONIC SYSTEM AND HEAT DISSIPATION DEVICE THEREOF

BACKGROUND

1. Technical Field

The present disclosure relates to heat dissipation from electronic devices, and particularly to a heat dissipation device with fasteners for stably fastening the heat dissipation device in an electronic system.

2. Description of Related Art

Electronic components, such as central processing units (CPUs) comprise numerous circuits operating at high speed and generating substantial heat. Under most circumstances, it is necessary to cool the CPUs in order to maintain safe operating conditions and assure that the CPUs function properly and reliably. Typically, a finned metal heat dissipation device is attached to an outer surface of the CPU to remove the heat therefrom. The heat absorbed by the heat dissipation device is then dissipated to ambient air. Conventionally, the heat sink is secured to a printed circuit board on which the CPU is mounted. The printed circuit board is in turn mounted in an electronic device.

The heat dissipation device made of metal is supported solely by the printed circuit board and the CPU. In assembly, transport or use, vibration or shaking is liable to occur. When this happens, the heavy heat dissipation device may cause the printed circuit board to deform. Typically, the printed circuit board has many chips mounted thereon by a plurality of soldered balls located in a plane. The solder balls are liable to fracture due to the deformation of the printed circuit board, and such damage typically causes the printed circuit board to malfunction.

What is needed, therefore, is a heat dissipation device which can overcome the above-described problems.

BRIEF DESCRIPTION OF THE DRAWINGS

Many aspects of the present embodiment(s) can be better understood with reference to the accompanying drawing. The components in the drawing are not necessarily drawn to scale, the emphasis instead placed upon clearly illustrating the principles of the present embodiment(s). Moreover, in the drawing, like reference numerals designate corresponding parts throughout the whole view.

The drawing is a schematic, cross-sectional view of a heat dissipation device in accordance with an embodiment of the disclosure, showing the heat dissipation device attached to an electronic component mounted on a printed circuit board, and the printed circuit board secured on a casing of an electronic system.

DETAILED DESCRIPTION

Referring to the drawing, a heat dissipation device in accordance with an embodiment of the disclosure is used for dissipating heat generated by an electronic component 200 mounted on a printed circuit board 100. In use, the printed circuit board 100 is secured to a board 400 of an electronic system, such as a sidewall of a computer case, via a plurality of screwing members 300. The screwing members 300 can be of any suitable kind known in the art, such as two-piece screwing members. The heat dissipation device comprises a heat sink 10, a centrifugal fan 20 fixed on the heat sink 10, and a plurality of fasteners 30 securing the heat sink 10 onto the electronic component 200.

The heat sink 10 is made of metal with good heat conductivity, such as aluminum, copper, or alloys thereof. The heat sink 10 comprises a base 12 having a bottom face to which the electronic component 200 is attached, and a plurality of fins 14 extending upwardly from a top face of the base 12. The fins 14 are spaced from and parallel to each other. A passage (not labeled) is defined between every two adjacent fins 14 to allow airflow therethrough.

The centrifugal fan 20 is horizontally disposed on a top of the heat sink 10. Airflow generated by the centrifugal fan 20 directly flows through the passages of the fins 14 of the heat sink 10. It is understood that the centrifugal fan 20 can also be disposed on a lateral side of the heat sink 10 in alternative embodiments.

Each of the fasteners 30 comprises a screwing post 32 engaging with the heat sink 10, a supporting member 34 fixed into the printed circuit board 100, and an engaging member 36 mounted in the board 400. The supporting member 34 comprises an annular seat 340, and a tubular body 342 extending upwardly from the seat 340. The seat 340 is attached to a bottom face of the printed circuit board 100. The tubular body 342 is inserted into the printed circuit board 100. At least a main portion of the screwing post 32, including a bottom of the screwing post 32, is threaded (not shown). The screwing post 32 extends through the printed circuit board 100 via the tubular body 342 of the supporting member 34. The screwing post 32 is screwed through and threadedly engaged with the tubular body 342 of the supporting member 34. The engaging member 36 comprises a mounting portion 360 fixed into the board 400, and a tubular engaging portion 362 extending upwardly from the mounting portion 360. The tubular engaging portion 362 has an inner thread (not shown). The bottom portion of the screwing post 32 is screwed into and threadedly engaged with the engaging portion 362 of the engaging member 36. A top end of the engaging member 36 abuts against a bottom face of the seat 340 of the supporting member 34.

In use, for each of the fasteners 30, the tubular engaging portion 362 of the engaging member 36 abuts against the seat 340 of the supporting member 34, whereby the supporting member 34 is supported by the engaging member 36. The engaging member 36 is fixed in the board 400, and the supporting member 34 is fixed in the printed circuit board 100. The screwing post 32 is extended through the heat sink 10 and screwed through the supporting member 34, and is screwed into the engaging member 36. The fasteners 30 thereby secure the heat sink 10 and the printed circuit board 100 together with the board 400. Thus, the printed circuit board 100 can withstand a certain degree of vibration or shake.

It is to be understood, however, that even though numerous characteristics and advantages of the present embodiment(s) have been set forth in the foregoing description, together with details of the structures and functions of the embodiment(s), the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device adapted for dissipating heat generated by an electronic component mounted on a printed circuit board, the printed circuit board secured on a casing of an electronic system, the heat dissipation device comprising:
   a heat sink disposed on the electronic component; and
   a plurality of fasteners extending through the heat sink, respectively, to assemble the heat sink to the printed circuit board, each of the fasteners comprising:

a supporting member for being fixed in the printed circuit board;
an engaging member for being fixed in the casing; and
a screwing post engaging with the heat sink, the screwing post extending through the printed circuit board via the supporting member and a bottom portion of the screwing post screwed into the engaging member;
wherein the supporting member comprises an annular seat and a tubular body extending upwardly from the seat, the seat adapted for attaching to a bottom face of the printed circuit board, the tubular body adapted for being inserted into the printed circuit board.

2. The heat dissipation device of claim 1, wherein the engaging member abuts against a bottom of the supporting member.

3. The heat dissipation device of claim 1, wherein the screwing post extends through the tubular body of the supporting member.

4. The heat dissipation device of claim 3, wherein the screwing post is threadedly engaged with the tubular body of the supporting member.

5. The heat dissipation device of claim 1, wherein the engaging member comprises a mounting portion adapted for being fixed into the board, and a tubular engaging portion extending upwardly from the mounting portion, the bottom portion of the screwing post screwed into the engaging portion.

6. The heat dissipation device of claim 5, wherein a top end of the engaging member abuts against a bottom face of the seat of the supporting member.

7. The heat dissipation device of claim 1, further comprising an axial fan fixed on the heat sink.

8. The heat dissipation device of claim 1, wherein the heat sink comprises a base on adapted for attaching to the electronic component, and a plurality of fins extending upwardly from the base.

9. The heat dissipation device of claim 8, wherein the fins are spaced from each other, and a passage is defined between every two adjacent fins.

10. An electronic system comprising:
a case having a sidewall;
a printed circuit board secured on the side wall, the printed circuit board having an electronic component mounted thereon; and
a heat dissipation device for dissipating heat of the electronic component, the heat dissipation device comprising
a heat sink attached to the electronic component; and
a plurality of fasteners extending through the heat sink to assemble the heat sink to the printed circuit board, each of the fasteners comprising:
a supporting member fixed in the printed circuit board;
an engaging member fixed in the sidewall; and
a screwing post extending through the heat sink and the supporting member, with a bottom portion of the screwing post screwed into the engaging member;
wherein the supporting member comprises an annular seat and a tubular body extending upwardly from the seat, the seat being attached to a bottom face of the printed circuit board, the tubular body being inserted into the printed circuit board.

11. The electronic system of claim 10, wherein the engaging member abuts against a bottom of the supporting member.

12. The electronic system of claim 10, wherein the bottom portion of the screwing post extends through the tubular body of the supporting member.

13. The electronic system of claim 12, wherein the screwing post is threadedly engaged with the tubular body of the supporting member.

14. The electronic system of claim 10, wherein the engaging member comprises a mounting portion fixed into the board, and a tubular engaging portion extending upwardly from the mounting portion, the bottom portion of the screwing post being screwed into the engaging portion.

15. The electronic system of claim 14, wherein a top end of the engaging member abuts against a bottom face of the seat of the supporting member.

16. The electronic system of claim 10, wherein the heat sink comprises a base on which the electronic component is attached, and a plurality of fins extending upwardly from the base.

17. A heat dissipation device for dissipating heat generated by an electronic component mounted on a printed circuit board, the printed circuit board secured on a casing of an electronic system, the heat dissipation device comprising:
a heat sink configured for contacting the electronic component; and
a plurality of fasteners each provided for extending through the heat sink to attach the heat sink to the printed circuit board, each of the fasteners comprising:
a supporting member configured for being fixed in the printed circuit board;
an engaging member configured for being fixed in the casing, the engaging member comprising an inner thread; and
a screwing post, at least a bottom portion of the screwing post being threaded, the screwing post having a length sufficient for the screwing post to be extended through the heat sink, and through the printed circuit board via the supporting member, such that the bottom portion of the screwing post is threadedly engaged in the engaging member;
wherein the supporting member comprises an annular seat and a tubular body extending upwardly from the seat, the seat adapted for attaching to a bottom face of the printed circuit board, the tubular body adapted for being inserted into the printed circuit board.

* * * * *